United States Patent [19]

Yoshida et al.

[11] Patent Number: 4,806,503
[45] Date of Patent: Feb. 21, 1989

[54] METHOD FOR THE REPLACEMENT OF SEMICONDUCTOR DEVICES

[75] Inventors: Hirokazu Yoshida, Osaka; Hiroshi Nakatani, Tenri; Keiji Yamamura, Sakurai, all of Japan

[73] Assignee: Sharp Kabushiki Kaisha, Osaka, Japan

[21] Appl. No.: 922,322

[22] Filed: Oct. 23, 1986

[30] Foreign Application Priority Data

Oct. 25, 1985 [JP] Japan ............................ 60-239695

[51] Int. Cl.⁴ ............................................ H01L 21/60
[52] U.S. Cl. ............................... 437/206; 29/402.08; 29/847; 29/835; 29/853; 29/762; 437/180; 437/008; 437/923; 357/80
[58] Field of Search .................. 228/180.1; 357/69, 70, 357/80; 29/574, 589, 590, 582, 576 S, 847, 575, 835, 853; 206/330

[56] References Cited

U.S. PATENT DOCUMENTS

| | | | |
|---|---|---|---|
| 3,969,813 | 7/1976 | Minetti et al. | 29/575 |
| 4,012,832 | 3/1977 | Crane | 29/575 |
| 4,567,643 | 2/1986 | Droguet et al. | 29/575 |

FOREIGN PATENT DOCUMENTS

| | | |
|---|---|---|
| 5232674 | 8/1978 | Japan . |
| 5585350 | 5/1981 | Japan . |
| 5694753 | 6/1981 | Japan . |

OTHER PUBLICATIONS

Anderson et. al., "Josephson Package Repair", IBM Technical Disclosure Bulletin, vol. 26, No. 12, May 1984 pp. 6244-6245.

*Primary Examiner*—Brian E. Hearn
*Assistant Examiner*—Beverly A. Pawlikowski
*Attorney, Agent, or Firm*—Ciotti & Murashige, Irell & Manella

[57] ABSTRACT

A method for the replacement of semiconductor devices in a multi-chip module that is constructed by mounting semiconductor devices on a tape carrier used as an electrical wiring substrate, wherein when at least one of said semiconductor devices develops a flaw, it is cut away at the finger sections that connect said defective semiconductor device to the tape, and then a different and non-defective semiconductor device having finger sections longer than those of said defective semiconductor device that has been removed is connected to said tape in such a manner that the finger sections of said different and non-defective semiconductor device are joined and connected to the corresponding finger sections retained on said tape.

2 Claims, 3 Drawing Sheets

METHOD FOR THE REPLACEMENT OF SEMICONDUCTOR DEVICES

BACKGROUND OF THE INVENTION

1. Field of the invention

This invention relates to a method for replacing semiconductor devices wherein when at least one of the semiconductor devices mounted on a tape carrier by means of inner lead bonding becomes defective, it is replaced with another semiconductor device that is not defective.

2. Description of the prior art

Multi-chip modules can be constructed with semiconductor devices mounted on a tape carrier that is used as an electrical wiring substrate. This method is advantageous in that inner lead bonding alone suffices for assembly, so that outer lead bonding is not necessary, and that the tape can be used as an electrical wiring substrate.

However, in this method above, if only one of the semiconductor devices becomes defective after inner lead bonding, there is no way in which this emiconductor device can be replaced, which means that all of the semiconductor devices become useless.

SUMMARY OF THE INVENTION

The method for the replacement of semiconductor devices of this invention, which overcomes the above-discussed and numerous other disadvantages and deficiencies of the prior art, is a method for the replacement of semiconductor devices in a multi-chip module that is constructed by mounting semiconductor devices on a tape carrier used as an electrical wiring substrate, wherein when at least one of said semiconductor devices develops a flaw, it is cut away at the finger sections that connect said defective semiconductor device to the tape, and then a different and non-defective semiconductor device having finger sections longer than those of said defective semiconductor device that has been removed is connected to said tape in such a manner that the finger sections of said different and non-defective semiconductor device are jined and connected to the corresponding finger sections retained on said tape.

In a preferred embodiment, the different and non-defective semiconductor device having the finger sections longer than those of the defective semiconductor device that has been removed is a semiconductor device which has been cut away from a different multi-chip module in which semiconductor devices are mounted on a tape carrier used as an electrical wiring substrate.

Thus, the invention described herein makes possible the objects of (1) providing a method for the replacement of semiconductor devices, which makes it possible to replace semiconductor devices that are defective with semiconductor devices that are not defective when a tape carrier is provided with semiconductor devices by inner lead bonding; and (2) providing a method for the replacement of semiconductor devices, by which it is possible to avoid risk in microassembly for which advanced tape bonding techniques are required, thereby allowing great decreases in cost.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

Figure 1A:
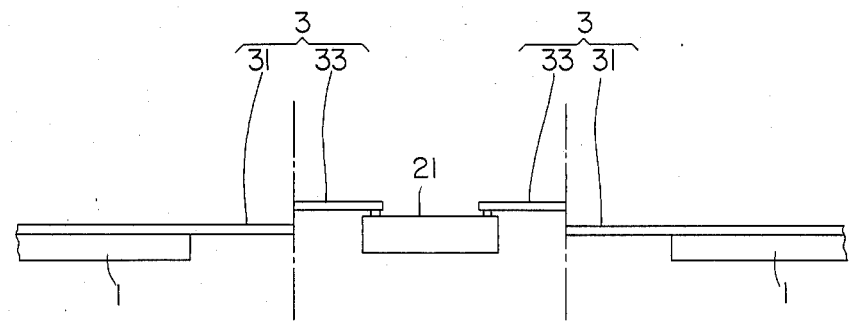
FIGS. 1(a) to 1(c) are diagrams showing a process for the replacement of semiconductor devices according to this invention.
Figure 3:
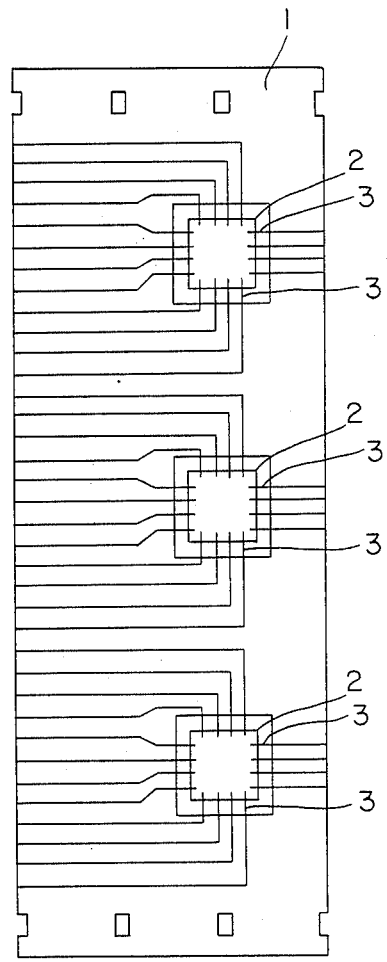
FIG. 3 is a plane view showing a multi-chip module in which semiconductor devices are mounted on a tape.

FIG. 3 shows an example of a multi-chip module constructed as a liquid-crystal driver, etc., in which a tape carrier is used as an electrical wiring substrate. The multi-chip module comprises a tape 1 made of polyimide resin, glass fiber reinforced epoxy resin, etc., and semiconductor devices 2 mounted on the tape 1 by means of inner lead bonding. Reference numerals 3 are the finger sections that connect the semiconductor devices 2 to the tape 1. When one of the semiconductor devices 2 in the multi-chip module becomes defective, it can be replaced with another semiconductor device as follows:

First, as shown in FIG. 1(a), the finger sections 3 are cut approximately at their centers.

Figure 1B:
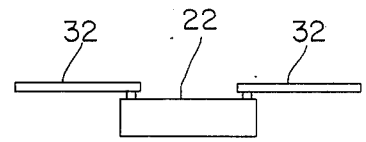

Then, as shown in FIG. 1(b), another semiconductor device 22 that is not defective is obtained, with finger sections 32 connected to the connecting leads of said semiconductor device 22, from another multi-chip module in which semiconductor devices are mounted on another tape 1 by means of inner lead bonding. The position at which the finger sections 32 are cut from the tape 1 is located further outside than the position at which the above-mentioned defective semiconductor device 21 is cut away. That is, the finger sections 32 of the non-defective semiconductor device 22 are cut so as to be longer than the finger sections 33 of the defective semiconductor device 21.

Figure 1C:
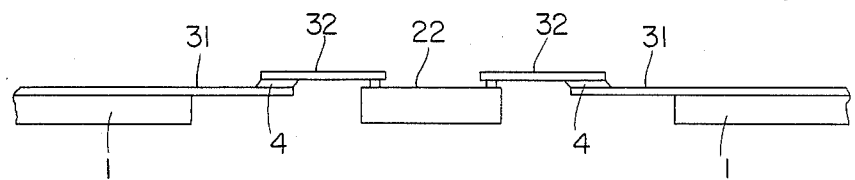

Then, as shown in FIG. 1(c), the finger sections 32 of this non-defective semiconductor device 22 are brought together with the finger sections 31 retained on the tape 1, from which the defective semiconductor device 21 has been removed, and the area 4 where the finger sections 31 and 32 overlap is connected by a Sn-Sn thermocompression bonding. The finger sections 31 and 32 can be also connected by an Au-Au thermocompression bonding, an Au-Sn eutectic alloy, or a soldering method.

Example 2

Figure 2A:
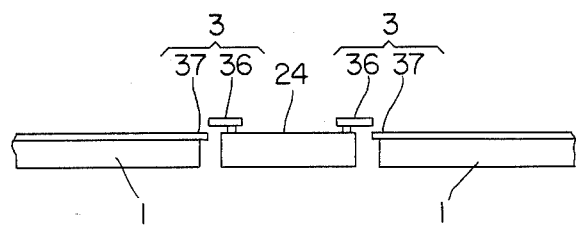
FIGS. 2(a) to 2(c) are diagrams showing another process for the replacement of semiconductor devices according to this invention.
Figure 2B:
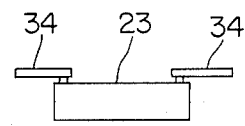
Figure 2C:
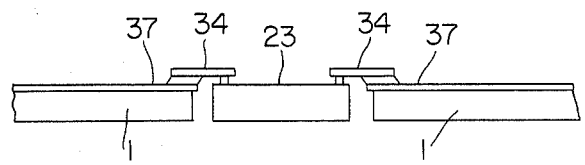

FIGS. 2(a) to 2(c) show an example of the replacement method in the case that the density of placement of the semiconductor devices is so high that the finger sections are short.

As shown in FIG. 2(a), the positions at which the finger sections 36 are cut are next to the tape 1, and accordingly, if a semiconductor device that is not defective is cut from a multi-chip module made in the same way, it would not be possible to cut the finger sections so that they would be longer than the finger sections 36 of the defective semiconductor device 24.

Thus, as shown in FIG. 2(b), a separate semiconductor device 23 that is not defective is made with the finger sections 34 longer than the finger sections 36 of the defective semiconductor device 24 that has been removed. This non-defective semiconductor device 23 is used as shown in FIG. 2(c), in which the finger sections 37 after removal of the defective semiconductor device 24 are joined and connected to the finger sections 34 of the non-defective semiconductor device 23. The process of the connection therebetween is the same as in the above-mentioned example.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the replacement of semiconductor devices in a multi-chip module that is constructed by mounting semiconductor devices on a tape carrier used as an electrical wiring substrate, wherein when at least one of said semiconductor devices develops a flaw, it is cut away at the finger sections that connect said defective semiconductor device to the tape, and then a different and non-defective semiconductor device having finger sections longer than those of said defective semiconductor device that has been removed is connected to said tape in such a manner that the finger sections of said different and non-defective semiconductor device are joined and connected to the corresponding finger sections retained on said tape.

2. A method according to claim 1, wherein said different and non-defective semiconductor device having the finger sections longer than those of the defective semiconductor device that has been removed is a semiconductor device which has been cut away from a different multi-chip module in which semiconductor devices are mounted on a tape carrier used as an electrical wiring substrate.

* * * * *